(12) United States Patent
Extrand et al.

(10) Patent No.: US 6,926,937 B2
(45) Date of Patent: *Aug. 9, 2005

(54) MATRIX TRAY WITH TACKY SURFACES (75) Inventors: Charles W. Extrand, Minneapolis, MN (US); Frank Manganiello, Maplewood, MN (US)

(73) Assignee: Entegris, Inc., Chaska, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/241,815

(22) Filed: Sep. 11, 2002

(65) Prior Publication Data

US 2004/0048009 A1 Mar. 11, 2004

(51) Int. Cl.$^7$ .......................... B29D 22/00; B29D 32/00; B32B 1/08
(52) U.S. Cl. ....................... 428/35.7; 206/714; 206/716; 206/722; 428/220; 414/940; 257/684; 257/686; 257/687
(58) Field of Search ................................. 206/710, 714, 206/716, 722; 428/34.1; 414/935, 940; 257/678, 684, 685–687

(56) References Cited

U.S. PATENT DOCUMENTS

| | | | |
|---|---|---|---|
| 4,382,024 A | 5/1983 | Seaman et al. | |
| 4,395,362 A | 7/1983 | Satoh et al. | |
| 4,667,944 A | 5/1987 | Althouse | |
| 4,711,014 A | 12/1987 | Althouse | |
| 4,746,574 A | 5/1988 | Hattori et al. | |
| 4,778,326 A | * 10/1988 | Althouse et al. | 414/800 |
| 4,800,126 A | 1/1989 | Leonardi | |
| 4,966,281 A | 10/1990 | Kawanishi et al. | |
| 5,075,038 A | 12/1991 | Cole et al. | |
| 5,089,314 A | 2/1992 | Masujima et al. | |
| 5,104,581 A | 4/1992 | Ito et al. | |
| 5,106,538 A | 4/1992 | Barma et al. | |
| 5,106,540 A | 4/1992 | Barma et al. | |
| 5,171,796 A | 12/1992 | Harris et al. | |
| 5,173,524 A | 12/1992 | Satoh | |
| 5,183,969 A | 2/1993 | Odashima | |

(Continued)

FOREIGN PATENT DOCUMENTS

| | | |
|---|---|---|
| EP | 0466937 B2 | 3/1998 |
| JP | 55 72029 | 5/1980 |
| JP | 5 32287 | 2/1993 |
| JP | 5 335787 | 12/1993 |
| JP | 7 122888 | 5/1995 |
| JP | 9 172059 | 6/1997 |
| JP | 2000 62787 A | 2/2000 |

Primary Examiner—Michael C. Miggins
(74) Attorney, Agent, or Firm—Patterson, Thuente, Skaar & Christensen, P.A.

(57) ABSTRACT

A tray for handling and retaining a plurality of small components comprising a rigid body portion with a plurality of pockets formed therein. Each of the pockets has an elastomeric contact surface for contacting and retaining a component. The contact surface may be formed from a thermoplastic material having a surface energy between 20 dyne/cm and 100 dyne/cm, and a surface electrical resistivity of between about $1 \times 10^4$ ohms/square and $1 \times 10^{12}$ ohms/square. The material for the contact portion may be urethane, polybutylene terephthalate, polyolefin, polyethylene terephthalate, styrenic block co-polymer, styrene-butadiene rubber, polyether block polyamide, or polypropylene/crosslinked EDPM rubber. The body portion may be formed from acrylonitrile-butadiene-styrene, polycarbonate, urethane, polyphenylene sulfide, polystyrene, polymethyl methacrylate, polyetherketone, polyetheretherketone, polyetherketoneketone, polyether imide, polysulfone, styrene acrylonitrile, polyethylene, polypropylene, fluoropolymer, polyolefin, or nylon. The body portion may have a peripheral border region and a downwardly projecting skirt portion to facilitate stacking of multiple trays.

45 Claims, 4 Drawing Sheets

U.S. PATENT DOCUMENTS

| | | |
|---|---|---|
| 5,208,103 A | 5/1993 | Miyamoto et al. |
| 5,240,753 A | 8/1993 | Tabuchi et al. |
| 5,304,418 A | 4/1994 | Akada et al. |
| 5,346,765 A | 9/1994 | Maeda et al. |
| 5,441,809 A | 8/1995 | Akhter |
| 5,547,082 A | 8/1996 | Royer et al. |
| 5,609,969 A | 3/1997 | Clatanoff et al. |
| 5,654,369 A | 8/1997 | Tsubaki et al. |
| 5,682,731 A | 11/1997 | Althouse |
| 5,685,885 A | 11/1997 | Khandros |
| 5,739,193 A | 4/1998 | Walpita et al. |
| 5,769,237 A | 6/1998 | Althouse et al. |
| 5,783,294 A | 7/1998 | Hiraiwa et al. |
| 5,791,486 A | 8/1998 | Brahmbhatt |
| 5,807,507 A | 9/1998 | Hirano et al. |
| 5,833,073 A | 11/1998 | Schatz et al. |
| 5,910,560 A | 6/1999 | Nagashima et al. |
| 5,914,191 A | 6/1999 | Hanson et al. |
| 5,922,453 A | 7/1999 | Horn, III et al. |
| 6,021,904 A | 2/2000 | Kozol et al. |
| 6,096,163 A | 8/2000 | Wensel |
| 6,150,446 A | 11/2000 | Numata |
| 6,230,896 B1 | 5/2001 | Lambert |
| 6,290,274 B1 | 9/2001 | Montoya |
| 6,357,595 B2 | 3/2002 | Sembonmatsu et al. |
| 2001/0032800 A1 | 10/2001 | Numazaki et al. |
| 2002/0014465 A1 | 2/2002 | Chung |

\* cited by examiner

| Substrate Materials | Contact Layer Materials |
|---|---|
| Group A (no surface treatment required) | |
| Acrylonitrile-Butadiene-Styrene (ABS) | Urethane (UR) |
| Polycarbonate (PC) | Polybutylene Terephthalate (PBT) |
| Urethane (UR) | Polyolefins (PO) |
| Polyphenylene Sulfide (PPS) | Polyethylene Terephthalate (PET) |
| Polystyrene (PS) | Styrenic Block Co-polymers (e.g. Kraton®) |
| Polymethyl Methacrylate (PMMA) | Styrene-Butadiene Rubber |
| Polyetherketone (PEK) | Nylon - Polyether Block Polyamide (PEBA) |
| Polyetheretherketone (PEEK) | Polypropylene/Crosslinked EDPM Rubber (e.g. Santoprene®) |
| Polyetherketoneketone (PEKK) | |
| Polyether Imide (PEI) | |
| Polysulfone (PS) | |
| Styrene Acrylonitrile (SAN) | |
| Group B (surface treatment or "tie layer" required) | |
| Polyethylene (PE) | |
| Polypropylene (PP) | |
| Fluoropolymers | |
| Polyolefins (PO) | |
| Nylon | |
| Polyamide (PA) | |

MATRIX TRAY WITH TACKY SURFACES

FIELD OF THE INVENTION

This invention relates to trays for handling device, more particularly it relates to trays for handling semiconductor devices.

BACKGROUND OF THE INVENTION

Processing of semi-conductor devices involves many processing steps. The devices are sensitive to physical and electrical damage, and must be handled carefully when being transported between processing steps. In addition, robots are often used to handle the devices during processing. These robots require precise positioning of the device to allow the robot to efficiently locate and engage the device. As a result, specialized trays have been developed to facilitate transport of the devices between processing steps.

One type of previous chip tray, known as a film frame, generally has a frame portion surrounding a thin film. On the top surface of the thin film, a layer of adhesive is disposed. A plurality of devices may then be arranged at any desired locations on the adhesive, and the adhesive serves to secure the devices in place. An example of such a film frame carrier may be seen in U.S. Pat. No. 5,833,073, a copy of which is fully incorporated herein by reference.

Other tray designs have been developed wherein physical structures, in the form of pockets, are used to secure a plurality of devices on the surface of the tray. An example of a pocketed matrix tray may be seen in U.S. Pat. No. 5,481,438. Some of these matrix tray designs, such as Japanese laid open patent application JP 05-335787, also include a multi-layer adhesive material in the bottom of the pockets for securing the devices in place.

A problem with previous trays using typical adhesive materials is that such adhesives may attract contaminants in the form of particles that can damage the devices. These contaminants can be difficult to remove from the tray by washing without causing degradation of the adhesive. In addition, the adhesive itself may contain solvents or other undesirable chemicals that can contaminate the devices or the process. Also, the adhesive itself may undergo changes in response to environmental conditions, becoming either too tacky so as to interfere with the operation of the robotic device handling process, or not tacky enough so as not to properly secure the devices in place.

Prior art matrix trays having pockets or other physical structures to retain the device may also present problems. Devices such as bare or leadless chips are not easily captured in a physical structure due to the lack of projections on the device. Also, the devices may become dislodged from the physical restraints during handling, leading to device damage or improper positioning for handling by a robot.

Thus, there is still a need for an improved tray for handling semiconductor devices.

SUMMARY OF THE INVENTION

The present invention is a matrix tray having electrostatic discharge (ESD) safe properties for handling and retaining a plurality of small components wherein the components are retained by adhesion between a surface of the components and a contact surface within the pockets of the tray. The contact surface is formed from a relatively soft thermoplastic elastomer material having a moderate to high surface energy and a surface electrical resistivity of between about $1 \times 10^4$ ohms/square and $1 \times 10^{12}$ ohms/square. The component is retained in place exclusively by adhesion with the thermoplastic contact surface and without other physical retaining structures or separate adhesives. The contact layer of the tray may be injection overmolded onto a surface in the pockets of the rigid tray body portion, which is preferably formed from rigid thermoplastic material. The contact surface and the rigid body portion may be held together with a polar bond formed during the injection molding process. The relative amount of adhesion provided by the contact surface may be adjusted by intermixing or alloying the thermoplastic elastomer material with impact modifying polymers or blends of other thermoplastic elastomers. In addition, the relative amount of adhesion and the electrical properties of the contact surface may be modified by intermixing or alloying the thermoplastic elastomer with inherently static dissipative or conductive polymers, inorganic filler material such as carbon fiber, carbon powder, metallic, or ceramics, or organic filler material. In addition, small depressions or projections arranged randomly or in a regular matrixical pattern may be provided in the contact layer to alter the amount of surface area, and resultant amount of adhesion, available for contact with the components to be retained.

Accordingly, the invention may be characterized in one aspect as a tray for handling and retaining a plurality of components comprising a rigid body portion with a plurality of pockets formed therein. Each of the pockets has an elastomeric contact surface for contacting and retaining a component. The contact surface may be formed from a thermoplastic material having a surface energy between 20 dyne/cm and 100 dyne/cm, and a surface electrical resistivity of between about $1 \times 10^4$ ohms/square and $1 \times 10^{12}$ ohms/square. The material for contact portion may be urethane, polybutylene terephthalate, polyolefin, polyethylene terephthalate, styrenic block co-polymer, styrene-butadiene rubber, polyether block polyamide, or polypropylene/crosslinked EDPM rubber. The body portion may be formed from acrylonitrile-butadiene-styrene, polycarbonate, urethane, polyphenylene sulfide, polystyrene, polymethyl methacrylate, polyetherketone, polyetheretherketone, polyetherketoneketone, polyether imide, polysulfone, rigid polyethylene, polypropylene, a fluoropolymer, polyolefin, nylon, polyamide, or any other suitable rigid polymer material. The body portion may have a peripheral border region and a downwardly projecting skirt portion or other structure to facilitate stacking of multiple trays.

The invention may also be characterized as a method of making a tray for handling and retaining a plurality of small components. The method includes the steps of forming a rigid body portion having a plurality of pockets from plastic material, and forming a component contact layer in the pockets.

It is a feature and advantage of the invention that the matrix tray has improved means of retaining components in the pockets or other structures, in that the components are retained only by adhesion between a flat surface of the component with a thermoplastic elastomer contact surface of the tray.

It is another feature and advantage of the invention that components are retained in place on the tray with sufficient force so that the tray can be inverted and can be subjected to normal shipping and handling shocks without the components being dislodged.

It is another feature and advantage of the invention that no lateral or vertical physical restraining structures are used to retain components in place on the tray, apart from the thermoplastic elastomer contact surface.

It is another feature and advantage of the invention that no separate adhesive substance is used on the contact layer surface to adhere the components to the contact surface, thereby reducing the amount of process contamination from solvents and other undesirable chemicals.

It is another feature and advantage of the invention that the tray contact surface and body portion may be ESD safe for the components retained.

It is another feature and advantage of the invention that the tray is more easily recyclable than known matrix trays.

It is another feature and advantage of the invention is that a stack of matrix trays according to the invention may be repositioned with the components retained in place, without the need for any lateral contact or constraint on the components, and without any contact with the top sides of the components.

It is yet another feature and advantage of the invention that the relative amount of the component attractive force provided by the surface may be adjusted to suit an individual application by selection or modification of the materials used or by alteration of the surface geometry of the contact layer.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION OF THE PREFERRED EMBODIMENTS

The accompanying Figures depict embodiments of the matrix tray of the present invention, and features and components thereof. Any references to front and back, right and left, top and bottom, upper and lower, and horizontal and vertical are intended for convenience of description, not to limit the present invention or its components to any one positional or special orientation. Any dimensions specified in the attached Figures and this specification may vary with a potential design and the intended use of an embodiment of the invention without departing from the scope of the invention.

As used herein, the term "about" means that dimensions, sizes, tolerances, formulations, parameters, shapes and other quantities and characteristics are not and need not be exact, but may be approximate and/or larger or smaller, as desired, reflecting tolerances, conversion factors, rounding off, measurement error and the like, and other factors known to those of skill in the art. In general, a dimension, size, formulation, parameter, shape or other quantity or characteristic is "about" or "approximate" whether or not expressly stated to be such.

The present invention comprises a matrix tray for handling semiconductor devices and other small components wherein the component has a surface area that can be placed into direct contact with a thermoplastic contact surface having moderate to high surface energy formed within a pocket, or on a structure of the tray. The tray is suitable for any type of component including those having no projections or leads, such as bare or leadless chips, but may also be used with devices having leads such as Chip Scale Package (CSP) devices. The devices are retained in the pockets of the tray without the use of a separate adhesive material, and without lateral or vertical physical restraints apart from the thermoplastic contact surface itself. In the invention, at least one contact surface in formed in each pocket of the tray. The contact surface comprises a relatively soft thermoplastic material having a moderate to high surface energy. The adhesion between a flat surface of the device and the contact surface retains the device during movement and normal handling of the tray while allowing the device to be easily lifted from the surface by a robotic handling apparatus. Further, the tray may be made ESD safe through the use of materials having a surface electrical resistivity of between about $1 \times 10^4$ ohms/square and $1 \times 10^{12}$ ohms/square for either or both the contact surface and the body portion.

Figure 1:
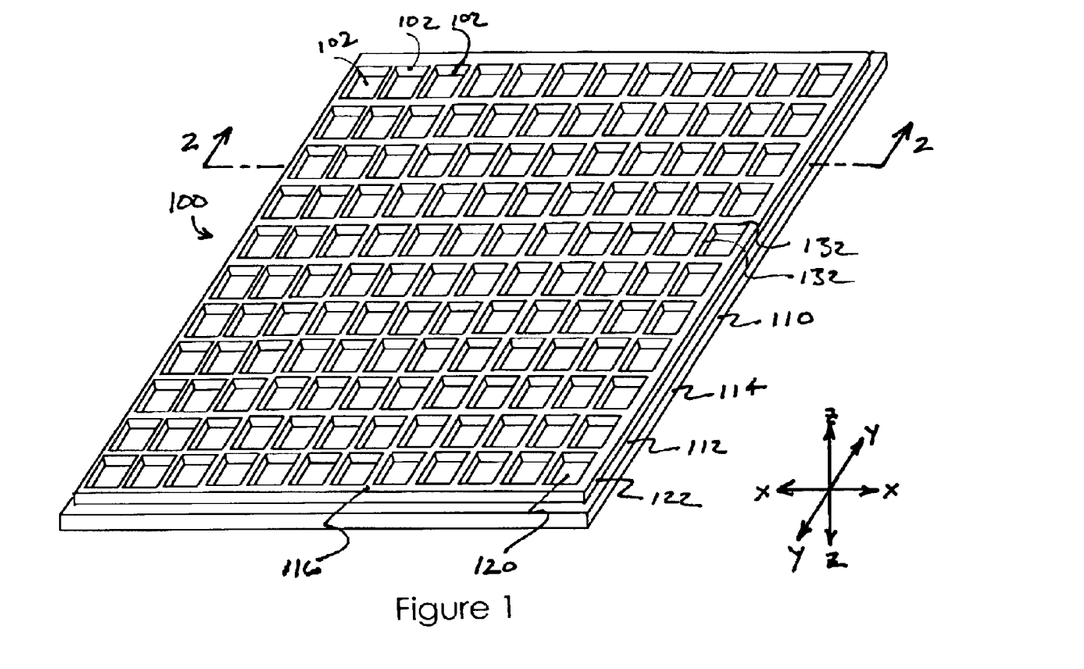
FIG. 1 is a perspective view of a preferred embodiment of the tray of the present invention.
Figure 2:
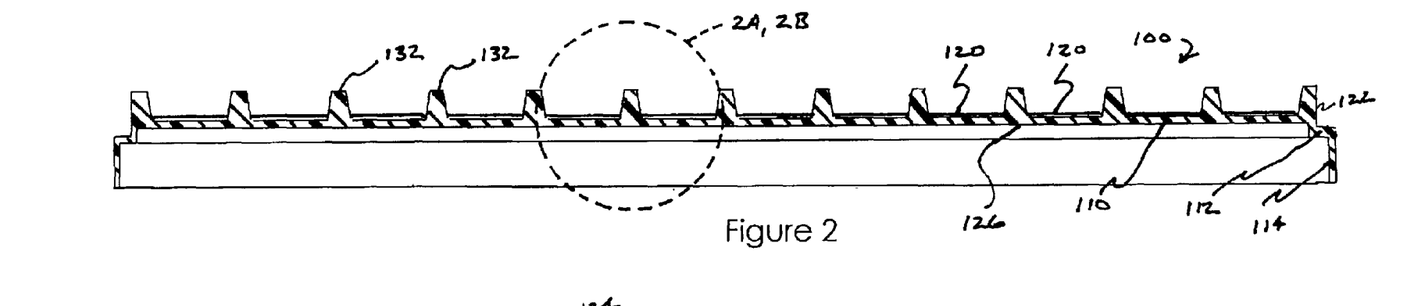
FIG. 2 is a cross section of the tray shown in FIG. 1.
Figure 4:
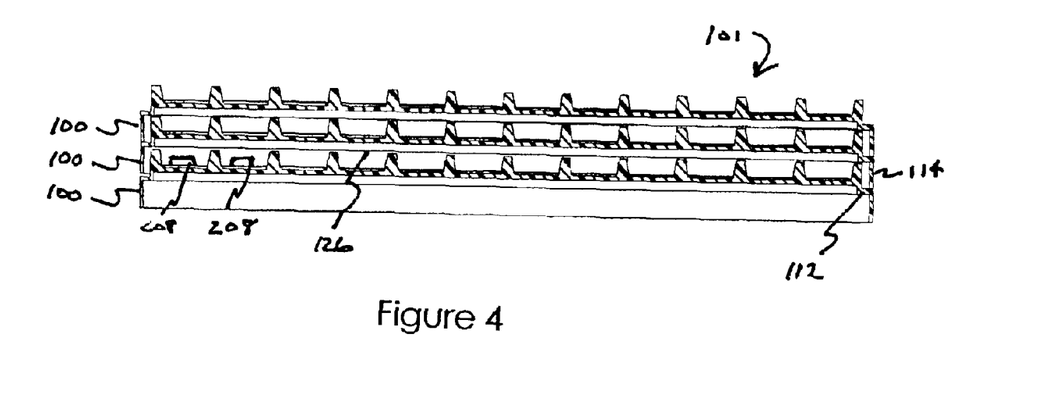
FIG. 4 is a cross sectional view of multiple trays in a stacked configuration.

In FIGS. 1 and 2 there is shown a preferred embodiment of the matrix tray 100 of the present invention. Tray 100 has rigid body portion 110 in which is formed a plurality of individual component receiving pockets 102 arranged in a matrix and oriented in a plane defined by the "x" and "y" axes as shown. Each pocket 102 has a depth dimension oriented in the "z" axis direction and contains at least one component contact surface 120 for engaging and retaining a single component. Body portion 110 preferably has a peripheral border region 112 projecting laterally outward beyond the edge 122 of matrix portion 116. A downwardly projecting skirt 114 may be provided on body portion 110. The skirt 114 is positioned so as to engage the peripheral border region 112 of a tray located immediately below when multiple trays are stacked as shown in FIG. 4. As an alternative to skirt 114, other structures such as downwardly projecting legs or posts may be used to facilitate stacking of multiple trays. It will be appreciated that although the pockets 102 are shown as being formed integrally in rigid body portion 110, other configurations wherein component receiving pockets or other structures are formed are contemplated and are within the scope of the invention. For example, the pocket defining cross members 132 may be formed in a separate grid work piece and attached to the remainder of rigid body portion 110 using adhesives, fasteners or other means.

According to the invention, contact surface 120 is formed from a polymeric elastomer material having a moderate to high surface energy, a relatively soft surface, and ESD safe properties. Although other polymers can be used, thermoplastics offer the general advantages of easier recyclability, greater purity with a smaller process contamination causing sol-fraction, and lower cost, and are hence preferred. Currently the preferred materials for contact surface 120 are relatively soft thermoplastic elastomers, including, for example, elastomeric variants of urethane (UR), polybutylene terephthalate (PBT), polyolefins (PO), polyethylene terephthalate (PET), styrenic block co-polymers (e.g. Kraton®), styrene-butadiene rubber, and nylon in the form of polyether block polyamide (PEBA). As an alternative, a thermoplastic vulcanizate material, such as polypropylene/crosslinked EDPM rubber, for example Santoprene® made by Advanced Elastomer Systems of Akron, Ohio, may be also used. The surface energy of the material is preferably 20 dyne/centimeter to 100 dyne/centimeter, more preferably between about 30 dyne/centimeter to 45 dyne/centimeter, and most preferably about 40 dyne/centimeter. The material preferably has a durometer hardness value of less than about Shore D75, and more than about Shore A15.

It is preferred that the contact surface be ESD safe, having a surface electrical resistivity value of between about $1\times10^4$ ohms/square and $1\times10^{12}$ ohms/square. Inherently static dissipative polymers may be intermixed or alloyed with the contact surface material to achieve the desired surface electrical resistivity. Also, an inherently conductive polymer, such as doped polyaniline, polypyrrole, polythiophene, polyisothianaphthene, polyparaphenylene, polyparaphenylene vinylene, polyheptadiyne, or polyacetylene may be used as an alloying polymer. As an alternative, carbon fiber, carbon powder, metallic particulate, ceramic particulate, or other electrically conductive fillers may be added to the material. Organic filler materials may also be used to alter the surface resistivity of the material, such as for example, quaternary ammonium salts, sulfonium salts, alkyl sulfonates, alkyl sulfates, alkyl phosphates, ethanol amides, ethanol amines, or fatty amines. Of course any other method or material may be used for the purpose which provides the requisite electrical properties along with the desired physical properties of surface energy, relative hardness and purity.

The amount of adhesion provided by contact surface 120 may be adjusted for particular applications wherein components with specific physical characteristics are to be retained. This adjustment may be accomplished by selecting or altering the material used for contact surface 120, or through alterations to the geometry and dimensions of the surface itself. Generally, for example, the materials having surface energies at the higher end of the ranges will be more strongly retentive of components than materials at the lower end of the ranges. Also, materials with hardness values at the softer end of the range will typically be more strongly retentive of components than will the harder materials. Any of the alloying or filler materials discussed above may also be intermixed or alloyed with the base material for the purpose of altering the surface energy or relative hardness of the base material. The desired relative hardness properties may also be achieved using impact modifying polymers or blends of other thermoplastic elastomers as alloying agents. Generally, it is desired that surface layer 120 provide a degree of adhesion to a component per unit of component area at least greater than the corresponding gravitational force per unit area of the component, thus permitting retention of the component even when the tray is inverted. It is most preferred that the amount of adhesion be sufficient to retain the components under shock and vibration loads typically encountered during shipping and handling operations.

The amount of adhesion may also be reduced by selectively altering the geometry and resulting amount of available component contact area of contact surface 120. This may be accomplished by forming a multiplicity of regular depressions 180 or projections 182 in contact surface 120 as shown in greatly exaggerated fashion for clarity in FIG. 5C or 5D, respectively. The depressions 180 or projections 182 may be arranged randomly or in a regular matrix pattern on contact surface 120. The depressions 180 or projections 182 may be from about 0.000040 inch to 0.10 inch in depth or height respectively, and spaced from about 0.000040 inch to about 0.30 inch apart, as may be needed to achieve the desired amount of adhesion. The features may be formed on contact surface 120 by stamping with a mold machined with a negative impression of the desired features. Generally, the mold may be machined using known machining techniques. Photolithography may be used to machine the mold to form regular features at the smaller ends of the ranges. As an alternative, a mold having a fine, random distribution of features may be made by sandblasting, glass beading, or shotpeening the mold surface.

Figures 2A, 2B:
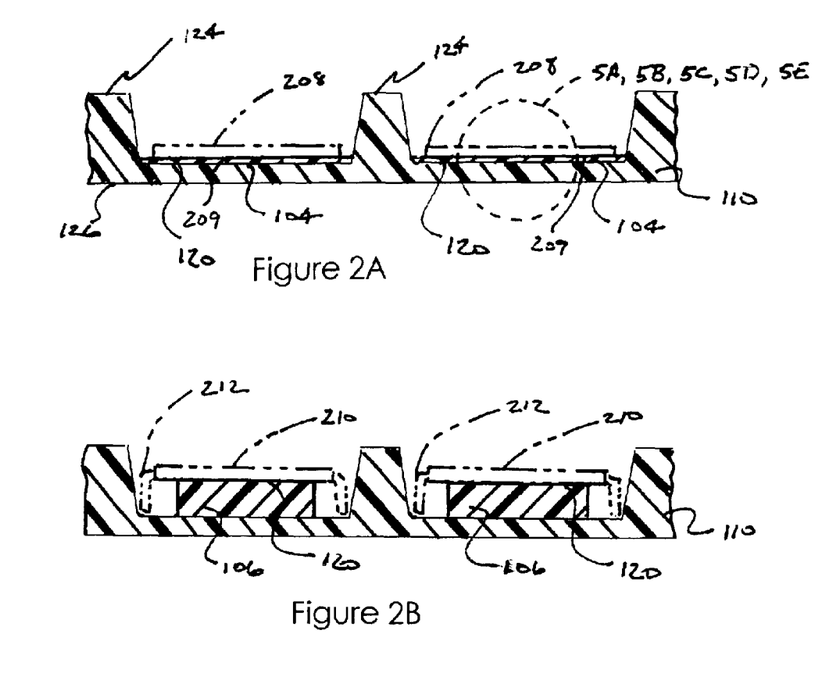
FIG. 2A is an enlarged view of the cross section of FIG. 2.
FIG. 2B is an enlarged view of the same cross section of FIG. 2, wherein an alternate embodiment is shown.
Figure 6:
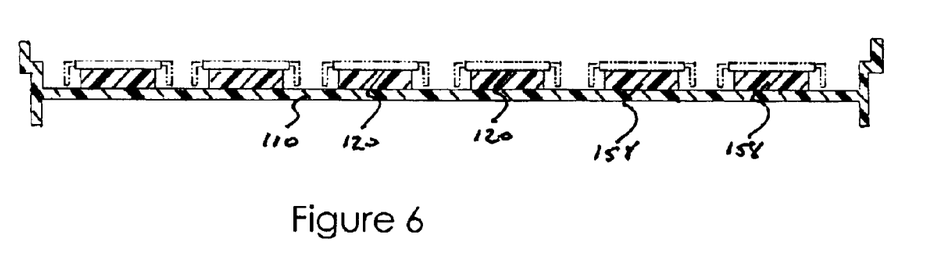
FIG. 6 is a cross sectional view of an alternative embodiment of the invention.

One preferred embodiment of a matrix tray, suitable for bare or leadless devices 208, is shown in FIG. 2A. The contact surface 120 is molded over the bottom 104 of each pocket 102 in a continuous layer. As may be seen, a device 208 has a surface 209 in direct contact with contact surface 120. Device 208 is retained in place by adhesion between surface 209 and contact surface 120 exclusively. As depicted, body portion 110 is not in direct contact with device 208 and does not constrain the device. Another embodiment shown in FIG. 2B has contact surface 120 formed as a part of a raised structure 106 within the pocket 102. As illustrated, this structure is particularly suitable for certain types of components 210 having projecting leads 212. As will be appreciated of course, the invention is not limited to the illustrated embodiments, and may include any pocket configuration or structure wherein a thermoplastic elastomer contact surface having the requisite properties is presented that can be placed into contact with the surface of a device. For instance, as shown in FIG. 6, the tray may include a matrix of platform structures 158 raised above the surface of the body portion of the tray 110 in place of recessed pockets. Contact surface 120 is provided at the top of each structure 158.

Figures 5A, 5C, 5E:
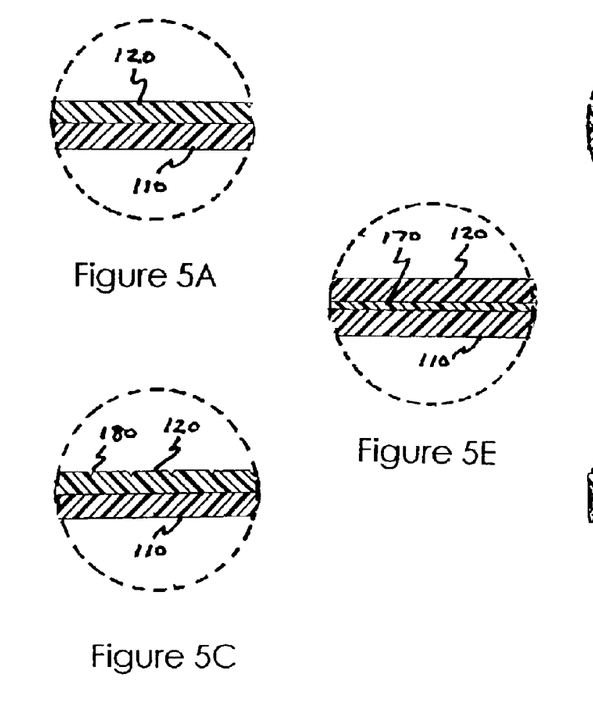
FIG. 5A is an enlarged view of a portion of the view of FIG. 2A.
FIG. 5C is another alternative enlarged view of a portion of the view of FIG. 2A.
FIG. 5E is still another alternative enlarged view of a portion of the view of FIG. 2A.
Figure 5B:
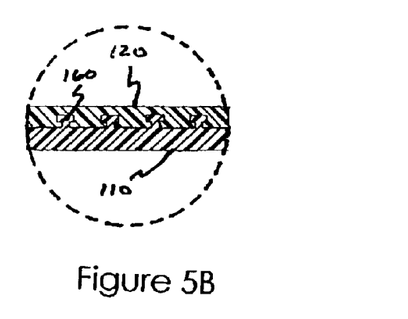
FIG. 5B is an alternative enlarged view of a portion of the view of FIG. 2A.
Figure 5D:
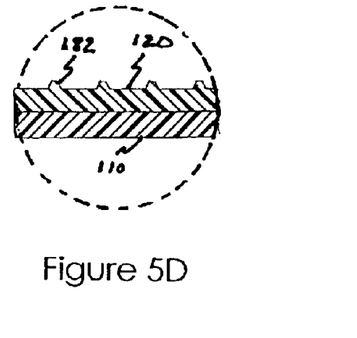
FIG. 5D is yet another alternative enlarged view of a portion of the view of FIG. 2A.

It is currently most preferred that contact surface 120 be injection overmolded onto a surface of rigid body portion 110 within each pocket 102 using standard injection molding techniques. Preferably, the materials for surface layer 120 and body portion 110 are selected so that a polar bond is formed during the injection molding process. The two layers may also be mechanically fastened together, or may be secured by a combination of methods. In addition, mechanical bonding structures 160, as shown best in FIG. 5B, may be provided on body portion 110 to enhance bonding efficacy. In addition, an intermediate or tie layer 170 may be used between the two materials to enhance bonding effectiveness as shown in FIG. 5E. It is preferred that thermoplastic polymers be used for body portion 110, as well as for contact portion 120, since thermoplastics tend to offer the general advantages of easier recyclability, greater purity with a smaller process contamination causing sol-fraction, and lower cost. Body portion 110 may be made ESD safe using the same materials and techniques as discussed for contact portion 120. Suitable rigid thermosetting polymers may also be used for body portion 110, but are less preferred.

Figure 3:
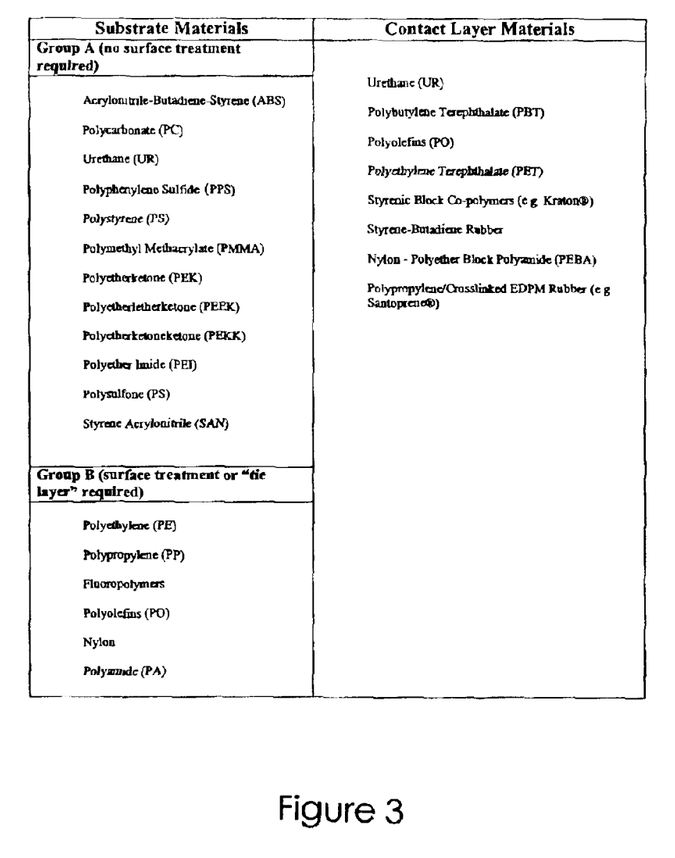
FIG. 3 is a table listing the various materials that may be used for the contact surface and body of the tray.

Body portion 110 provides rigidity and mechanical strength to the tray, and accordingly must be made from suitably rigid material and must have adequate thickness to withstand the mechanical loading anticipated during use and handling of the tray. Although any suitable polymer material having the desired qualities of rigidity, mechanical strength, and chemical compatibility may be used, some suitable polar polymer materials for body portion 110 are listed in the first column of the table found in FIG. 3. The listed "Group A" thermoplastic materials may be molded with any of the contact portion materials listed in the second column of the table without need for surface treatment of the body material, although surface treatment may be used to enhance bonding efficacy. The body materials listed in "Group B" are generally non-polar polymers, and require surface treatment in the form of corona, plasma, chemical, or flame treatment to achieve a proper polar bond with contact portion 120. As an alternative, the materials in "Group B" may be bonded using a separate intermediate tie layer of mutually compatible material, such as Bynel® made by Du Pont Corporation or Tymor® made by Nichimen Corporation.

During use of the tray, individual components may be placed in pockets 102 with a significant portion of the surface of the component in contact with the contact surface 120. The moderate to high surface energy and relative softness of contact surface 120 results in effective retention of the component on contact surface 120 by adhesion between the thermoplastic contact surface 120 and a surface of the device, but without the need for separate adhesives or other physical retaining structures. The ESD safe static dissipative properties of the materials for the contact surface, rigid body portion or both, provide electrical protection for the devices stored therein. The thermoplastic construction of the tray reduces the amount of process contamination contributed by the tray. Moreover, the thermoplastic components are more easily and completely recycled, for reduced environmental impact.

The stacking features of the invention are best seen with reference to FIGS. 2, 2A, and 4. In a stack of trays 101 as depicted in FIG. 4, each device 208 is in direct contact with, and is retained by contact surface 120. The devices 208 are disposed within pockets 102, and do not extend above the top surface 124 of cross members 132. When the trays 100 are stacked, downwardly projecting skirt 114 of each tray contacts and rests on peripheral border region 112 of the tray immediately below. Skirt 114 is of sufficient height so that bottom surface 126 of the tray is spaced apart from the top surfaces 124 of the tray immediately below. Devices 208 are retained in place only by adhesion with contact surface 120. The devices 208 are not laterally constrained within the pocket by body portion 110, and are not vertically constrained by contact with bottom surface 126 of the tray immediately above. The stack of trays 101 may be repositioned and even inverted without causing the devices 208 to be dislodged, and without the need for device contact with other trays or with other portions of the same tray.

Although the description above contains many specificities, these should not be construed as limiting the scope of the invention but as merely providing illustrations of some of the presently preferred embodiments of the invention. Thus, the scope of the invention should be determined by the appended claims and their legal equivalents, rather than by the examples given.

What is claimed is:

1. A matrix tray for handling and retaining a plurality of small components comprising:

a plastic rigid body portion having an upper surface with a plurality of pockets formed therein, each of said pockets adapted to receive one of said plurality of components; and an elastomeric layer molded in each of said plurality of pockets for contacting and retaining the component when the tray is disposed in an inverted position, said layer having an upwardly facing elastomeric contact surface and a downwardly facing concealed surface continuously contacting the rigid body portion, and being formed from a thermoplastic elastomer material having a surface energy between about 20 dyne/cm and about 100 dyne/cm, a hardness of between about Shore A15 and about Shore D75, and a surface electrical resistivity of between about $1 \times 10^4$ ohms/square and about $1 \times 10^{12}$ ohms/square with each component being laterally and vertically restrained in place exclusively by adhesion with said at least one component contact surface when the surface of the component is placed in contact with the component contact surface, and wherein the adhesion is at least sufficient so that the component, remains in place on the component contact surface when said tray is inverted.

2. The tray of claim 1, wherein each said contact surface has a multiplicity of depressions or projections formed thereon for reducing the adhesiveness thereof.

3. The tray of claim 1, wherein said body portion is formed from a rigid thermoplastic material selected from the group of rigid thermoplastic materials consisting of acrylonitrile-butadiene-styrene, polycarbonate, urethane, polyphenylene sulfide, polystyrene, polymethyl methacrylate, polyetherketone, polyetheretherketone, polyetherketoneketone, polyether imide, polysulfone, and styrene acrylonitrile.

4. The tray of claim 1 wherein said rigid body portion is formed from rigid polyethylene, polypropylene, fluoropolymer, polyolefin, polyamide, or nylon.

5. The tray of claim 1, further comprising a tie layer interposed between said body portion and said downwardly facing concealed surface.

6. The tray of claim 1, wherein each said contact surface has a surface energy of between about 30 dyne/cm and about 45 dyne/cm.

7. The tray of claim 1, wherein each said contact surface has a surface energy of about 40 dyne/cm.

8. The tray of claim 1, wherein said body portion has a peripheral border region and a downwardly projecting skirt portion, and wherein said skirt portion is adapted to engage the peripheral border region of a separate tray when the trays are stacked.

9. The tray of claim 1, wherein said rigid body portion has a surface electrical resistivity of from about $1 \times 10^4$ to about $1 \times 10^{12}$ ohms/square.

10. The fray of claim 1, wherein said rigid body portion is electrically conductive.

11. The tray of claim 1, wherein said elastomeric contact surface is formed from a thermoplastic elastomer material.

12. The tray of claim 11, wherein said thermoplastic elastomer material is selected from the group of thermoplastic elastomers consisting of urethane, polybutylene terephthalate, polyolefin, polyethylene terephthalate, styrenic block co-polymer, styrene-butadiene rubber, and polyether block polyamide.

13. The tray of claim 11, wherein said thermoplastic elastomer material is a thermoplastic vulcanizate.

14. The tray of claim 11, wherein said thermoplastic elastomer material is alloyed with an inherently static dissipative polymer or an inherently conductive polymer.

15. The tray of claim 11, wherein said thermoplastic elastomer material contains a filler material.

16. The tray of claim 15, wherein said filler material is an inorganic, conductive material.

17. The tray of claim 16, wherein said inorganic conductive material is carbon fiber, carbon powder, metallic particulate, or ceramic particulate.

18. The tray of claim 15, wherein said filler material is an organic material.

19. The tray of claim 18, wherein said organic material is quaternary ammonium salt, sulfonium salt, alkyl sulfonate, alkyl sulfate, alkyl phosphate, ethanol amide, ethanol amine, or fatty amine.

20. A matrix tray in combination with a plurality of components to be retained thereby, comprising:
    a plurality of components, each presenting a surface; and
    a matrix tray comprising:
        a plastic rigid body portion having a plurality of component receiving structures, each structure adapted to receive one of said plurality of components; and
        at least one contact layer having a downwardly facing concealed surface continuously molded on said rigid body portion and an upwardly facing component contact surface on each said component receiving structure, said component contact surface being formed from a thermoplastic elastomer material and having a surface energy of between about 20 dyne/centimeter to about 100 dyne/centimeter and a hardness of between about Shore A15 and about Shore D75, each component being laterally and vertically restrained in place exclusively by adhesion with said at least one component contact surface when the surface of the component is placed in contact with the component contact surface, and wherein the adhesion is at least sufficient so that the component remains in place on the component contact surface when said tray is inverted.

21. The combination of claim 20, wherein said component contact surface has a surface electrical resistivity of from about $1 \times 10^4$ to about $1 \times 10^{12}$ ohms/square.

22. The combination of claim 20, wherein said rigid body portion has a surface electrical resistivity of from about $1 \times 10^4$ to about $1 \times 10^{12}$ ohms/square.

23. The combination of claim 20, wherein said thermoplastic elastomer material is selected from the group consisting of urethane, polybutylene terephthalate, polyolefin, polyethylene terephthalate, styrenic block co-polymer, styrene-butadiene rubber, polyether block polyamide, and polypropylene/crosslinked EDPM rubber.

24. The combination of claim 20, wherein said thermoplastic elastomer material is alloyed with an inherently static dissipative polymer or an inherently conductive polymer.

25. The combination of claim 20, wherein said at least one component contact surface has a multiplicity of depressions or projections formed thereon for reducing the adhesiveness thereof.

26. The combination of claim 20, wherein said body portion is formed from a rigid thermoplastic material selected from the group of rigid thermoplastic materials consisting of acrylonitrile-butadiene-styrene, polycarbonate, urethane, polyphenylene sulfide, polystyrene, polymethyl methacrylate, polyetherketone, polyetheretherketone, polyetherketoneketone, polyether imide, polysulfone, and styrene acrylonitrile.

27. The combination of claim 20, wherein said rigid body portion is formed from rigid polyethylene, polypropylene, fluoropolymer, polyolefin, polyamide, or nylon.

28. The combination of claim 20, further comprising a tie layer interposed between said body portion and said component contact surface.

29. The combination of claim 20, wherein said component contact surface has a surface energy of between about 30 dyne/cm and about 45 dyne/cm.

30. The combination of claim 20, wherein said component contact surface has a surface energy of about 40 dyne/cm.

31. The combination of claim 20, wherein said body portion has a peripheral border region and a downwardly projecting skirt portion, and wherein said skirt portion is adapted to engage the peripheral border region of a separate tray when the trays are stacked.

32. The combination of claim 20, wherein said component receiving structure is a pocket, and said component contact surface is formed in the bottom of said pocket.

33. The combination of claim 20, wherein said thermoplastic elastomer contains a filler material.

34. The combination of claim 33, wherein said filler material is carbon fiber, carbon powder, metallic particulate, or ceramic particulate.

35. The combination of claim 33, wherein said filler material is an organic material.

36. A method of making a matrix tray for handling and retaining a plurality of small components comprising the steps of:
    forming a rigid body portion having a plurality of individual component receiving pockets from plastic material; and
    forming a component contact surface by molding a component contact layer comprising a thermoplastic elastomer in each of said pockets, said component contact layer having a downwardly facing concealed surface in continuous contact with the rigid body portion and an upwardly facing component contact surface comprising a thermoplastic elastomer and having a surface energy of between about 20 dyne/centimeter and about 100 dyne/centimeter, a hardness of between about Shore A15 and about Shore D75, and a surface electrical resistivity of from about $1 \times 10^4$ to about $1 \times 10^{12}$ ohms/square, said component contact surface having sufficient adhesion so as to retain each of the plurality of components when said tray is inverted.

37. The method of claim 36, further comprising the step of forming a plurality of mechanical bonding structures in each said pocket for bonding the concealed surface to the rigid body portion.

38. The method of claim 36, wherein said body portion is formed from rigid polyethylene, polypropylene, or a fluoropolymer, and further comprising the step of surface treating a portion of each said pocket with a corona, plasma, flame, or chemical treatment process.

39. The method of claim 36 further comprising the step of forming an intermediate tie layer between said body portion and said concealed surface in each said pocket.

40. A matrix tray for handling and retaining a plurality of components comprising:
    a plastic rigid body portion having a plurality of individual component receiving pockets; and
    means in each pocket for retaining one of said plurality of component, said means providing at least a sufficient retentive force to the component so that the component is retained in place exclusively by said means when said tray is inverted, wherein said means for retaining one of said plurality of components comprises a contact layer of thermoplastic elastomer material, said layer being in continuous contact with the rigid body portion and having a surface energy of between about 30 dynes/centimeter and about 45 dynes/centimeter, a hardness of between about Shore A15 and about Shore 75, and a surface electrical resistivity of between about $1\times10^4$ and $1\times10^{12}$ ohms/square.

41. The tray of claim 40, wherein said thermoplastic elastomer is selected from the group consisting of urethane, polybutylene terephthalate, polyolefin, polyethylene terephthalate, styrenic block co-polymer, styrene-butadiene rubber, polyether block polyamide, and polypropylene/crosslinked EDPM rubber.

42. The tray of claim 40, wherein said contact layer has a multiplicity of depressions or projections formed therein for reducing the adhesiveness thereof.

43. The tray of claim 40, wherein said body portion is formed from acrylonitrile-butadiene-styrene, polycarbonate, urethane, polyphenylene sulfide, polystyrene, polymethyl methacrylate, polyetherketone, polyetheretherketone, polyetherketoneketone, polyether imide, polysulfone, styrene acrylonitrile, polyethylene, polypropylene, fluoropolymer, polyolefin, polyamide, or nylon.

44. A method for retaining a plurality of components on a matrix tray comprising:

providing a plurality of components, each presenting a surface;

providing a matrix tray comprising a rigid, thermoplastic body portion having a plurality of individual component receiving pockets and a component contact layer in each of said pockets, said component contact layer having an upwardly facing component contact surface and a downwardly facing concealed surface continuously molded to the upper surface with the contact layer comprising a thermoplastic customer and having a surface energy of between about 20 dyne/centimeter and about 100 dyne/centimeter, a hardness of between about Shore A15 and about Shore D75, and a surface a electrical resistivity of from about $1\times10^4$ to about $1\times10^{12}$ ohms/square; and placing each of said plurality of components in a rate one of said component receiving pockets with the surface of each component in contact with the component contact surface, each of said plurality of components being retained in place exclusively by adhesion with said thermoplastic elastomer of said component contact surface, with the adhesion being sufficient to keep a small component in place on the contact surface when said tray is inverted such that the contact surface faces downward.

45. A system of stackable matrix trays in combination with a plurality of components to be retained in said matrix trays, the combination comprising:

a plurality of components, each presenting a surface; and a plurality of matrix trays, each tray comprising:

a generally planar rigid body portion having an upper surface with a plurality of component receiving structures arranged in a matrixical pattern thereon, said body portion having a peripheral border region and at least one downwardly projecting structure for engaging the peripheral border region of a separate one of said plurality of trays when the trays are stacked, each component receiving structure having a component contact surface, said component contact surface being formed from a thermoplastic elastomer material that is in continuous contact with the upper surface and having a surface energy of between about 20 dyne/centimeter and about 100 dyne/centimeter, a hardness of between about Shore A15 and about Shore D75, and a surface electrical resistivity of from about $1\times10^4$ to about $1\times10^{12}$ ohms/square, the surface of each component in said plurality of components being engagable with the component contact surface of a separate one of said plurality of component receiving structures, wherein each component of said plurality is laterally and vertically restrained in place exclusively by adhesion with said at least one component contact surface, and wherein the adhesion is sufficient so that the component remains in place on the component contact surface whet, the tray is inverted.

* * * * *